(12) United States Patent
Hopper et al.

(10) Patent No.: US 7,796,007 B2
(45) Date of Patent: Sep. 14, 2010

(54) TRANSFORMER WITH SIGNAL IMMUNITY TO EXTERNAL MAGNETIC FIELDS

(75) Inventors: Peter J. Hopper, San Jose, CA (US); William French, San Jose, CA (US); Kyuwoon Hwang, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 13 days.

(21) Appl. No.: 12/315,930

(22) Filed: Dec. 8, 2008

(65) Prior Publication Data

US 2010/0141374 A1   Jun. 10, 2010

(51) Int. Cl.
*H01F 5/00* (2006.01)

(52) U.S. Cl. .................... 336/200; 336/223; 336/232; 336/226

(58) Field of Classification Search ............. 336/232, 336/225–226
See application file for complete search history.

(56) References Cited

U.S. PATENT DOCUMENTS

| | | | |
|---|---|---|---|
| 6,121,768 A * | 9/2000 | Taurand | 324/117 R |
| 2006/0238273 A1 * | 10/2006 | Tomonari et al. | 333/185 |
| 2008/0278275 A1 * | 11/2008 | Fouquet et al. | 336/84 M |

* cited by examiner

*Primary Examiner*—Anh T Mai
(74) *Attorney, Agent, or Firm*—Jurgen K. vollrath; Vollrath & Associates

(57) ABSTRACT

In an on-chip transformer, external electromagnetic field influences are reduced by providing an isolation transformer having primary and secondary windings with a figure 8 configuration so that current induced by an external magnetic field is nulled.

3 Claims, 1 Drawing Sheet

SQUARE INDUCTOR
L1 AND L2 COUPLING ~0.6

SQUARE INDUCTOR
L1 AND L2 COUPLING ~0.6

8-SHAPED 1:1 TRANSFORMER-
HIGH MAGNETIC FIELD IMMUNITY

TRANSFORMER WITH SIGNAL IMMUNITY TO EXTERNAL MAGNETIC FIELDS

FIELD

The present invention relates to transformer designs. In particular it relates to on-chip transformers as are commonly used for transient voltage rejection.

BACKGROUND OF THE INVENTION

It is common to provide on-chip transformers to provide transient voltage rejection. As the rate of change of the voltage (dV/dt) in the primary winding of the transformer increases the back electromagnetic field (EMF) increases. Thus, with increasing frequency, as is the case with voltage transients, the reactance increases and the windings act as low pass filters thereby rejecting the transient voltage. However, these on-chip transformers remain susceptible to external magnetic fields. As shown in FIG. 1, as the component of any external magnetic flux (H) 100 passes parallel to the coil axis it generates a current 102 in the coil 104. This effect is evident in both the primary and secondary windings of a transformer. One such prior art on-chip transformer is shown in FIG. 2, which shows a primary winding 200 formed by etching a metal layer to define a helical configuration. The transformer further includes a secondary winding 202, again defined by a helically etched metal layer. Typically these helical coils 200, 202 are formed by photolithographic techniques as known in the art. As will be appreciated from the discussion above, an external magnetic field 210 will generate current in both the secondary winding 202 and the primary 200. Thus, current will flow in the secondary winding 202 due not only to the current directly induced in the secondary winding by the magnetic field but also due to the magnetic coupling between the primary and secondary windings 200, 202, which causes the current induced in the primary winding 200 to be transferred to the secondary 202. It will therefore be appreciated that any external magnetic fields that pass through the transformer windings perpendicular to the windings (parallel to the axes of the windings, which in the transformer shown in FIG. 2 coincide with one another) will cause substantial interference.

In the field of electric guitars the vibration of the guitar strings is translated into sound by making use of pick-ups. These comprise coils formed around one or more permanent magnets. The permanent magnets define a magnetic field, which if altered, produces a current in the coils. By placing a pick-up underneath each of the guitar strings, the vibration of the string, which passes through the magnetic field of the magnet causes the reluctance to change, which produces a current in the coil that is then coupled though an amplifier to a speaker to produce sound. In U.S. Pat. Ser. No. 3,962,946 to Rickard, the use of two coils wound in opposite directions is described, with permanent magnet cores oriented in opposite directions (north-south in the one and south-north in the adjacent one). Thus the magnetic fields generated by the two adjacent magnets have flux lines flowing in opposite directions to produce currents flowing in opposite directions in the coils when the guitar string is plucked. However, since the coils themselves are oppositely wound and connected in series, the currents combine. On the other hand any external magnetic fields passing through the windings will cause currents generated in the two coils to cancel each other out to eliminate noise or hum due to interference from external magnetic fields such as the 60 Hz mains interference. The present invention seeks to reduce interference from external magnetic fields in an on-chip de-coupling transformer.

SUMMARY OF THE INVENTION

According to the invention, there is provided a transformer comprising a primary winding and a secondary winding, the primary and secondary windings each including a first winding and a second winding wound in opposite directions and connected in series. The primary and secondary windings of the transformer may be formed as part of an integrated circuit. The primary and secondary windings may include a core, which may comprise a ferromagnetic core. Thus the windings may include an air core or a ferromagnetic core.

The first and second windings of both the primary and the secondary windings may be configured as traces substantially in the form of a figure 8 to define a clockwise first winding and a counter-clockwise second winding.

Further, according to the invention, there is provided a method in a semiconductor device of increasing signal immunity to external magnetic fields, comprising providing a voltage isolation on-chip transformer that includes a primary and a secondary winding each of which has a topology arranged to provide for canceling or nulling of current in the winding that is induced by an external magnetic field. Each of the windings may have a figure 8 topology, which may be formed by known photolithographic techniques.

DETAILED DESCRIPTION OF THE INVENTION

In the above discussion of the prior art, the use of pickups in electric guitars was discussed and the solution proposed by Rickard to reduce noise from external magnetic fields. Rickard deals with wire coils formed around permanent magnet cores that pre-define an electric field passing through the coils under normal operation. A single figure-8 coil is provided for each pickup to provide for current canceling during external magnetic field influences. It does not deal with voltage conversion using transformers or with the use of isolation transformers and does not contemplate any on-chip applications.

The present invention, on the other hand deals with voltage isolation transformers that are provided in integrated circuits (ICs) and the problem of noise due to external electromagnetic interference that has plagued engineers and other people skilled in the art relating to circuit design and more specifically isolation devices used in ICs.

Figure 1:
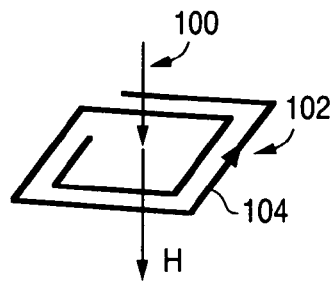
FIG. 1 is a three dimensional view of a coil showing current generation due to an external magnetic field.
Figure 2:
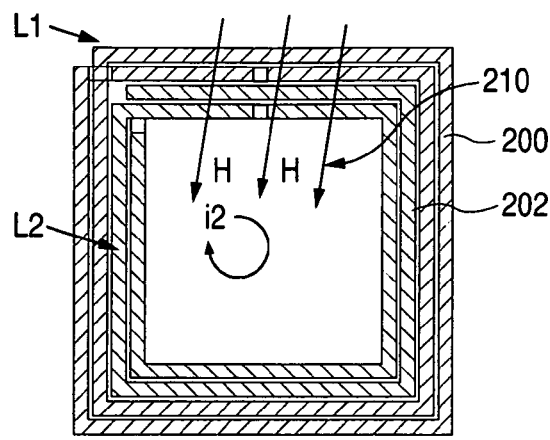
FIG. 2, shows the effect of an external magnetic field on a transformer with helical primary and secondary windings.
Figure 3:
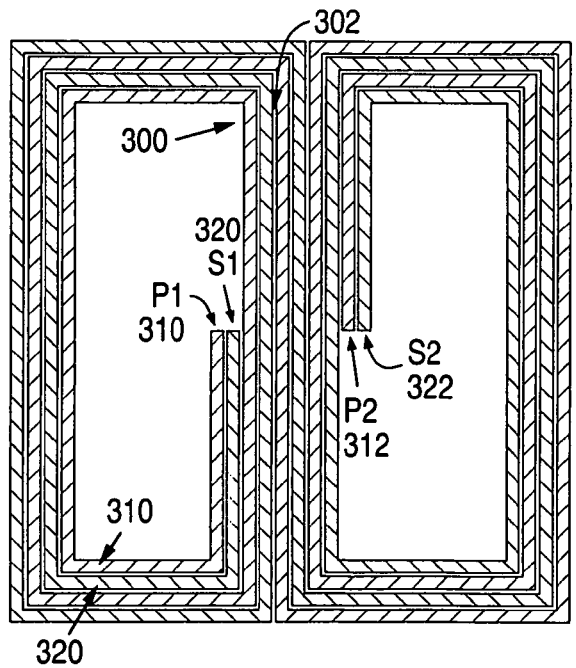
FIG. 3 is a top view of one embodiment of a primary or secondary winding of the invention.

The present invention proposes forming a primary winding and a secondary winding of a transformer each in the shape of a figure-8. The windings are etched during processing of the IC using photolithographic techniques, as is known in the art. In the embodiment shown in FIG. 3, a primary winding 300 and a secondary winding 302 are formed to define traces running substantially parallel to each other and each defining a first clockwise helical coil and a second counter-clockwise helical coil. The first coil of the primary winding is defined in FIG. 3 by reference numeral 310, the second coil of the primary winding by reference numeral 312, first coil of the secondary winding by reference numeral 320 and the second coil of the secondary winding by reference numeral 322.

When a signal passes through the primary winding 300 it produces a magnetic field which couples with the secondary winding 302 to produce a current in the secondary winding. On the other hand, any external magnetic field or component thereof passing parallel to the axes of the windings (passing into or out of the page in FIG. 3), e.g. electromagnetic radiation due to 60 Hz mains AC will cause current to flow either clockwise in both or counter-clockwise in both the first and secondary coils of the secondary winding 302 and in both the first and secondary coils of the primary winding 300. The result is that the induced currents in the secondary winding 302 cancel each other out, and the induced currents in the primary winding 300 also cancel each other out. Consequently no noise is produced on the secondary side due to the external magnetic field.

While the above embodiment made use of planar helical coils, the invention could be implemented in an IC using different configurations provided that both the primary and secondary windings of the resultant transformer include two serially connected coils that produced currents that cancel each other out when magnetic flux lines pass through the coils in the same direction.

What is claimed is:

1. A transformer comprising
a primary winding and
a secondary winding, the primary and secondary windings defined as traces in an integrated semiconductor and formed in the same plane to define a primary and a secondary winding formed in a common plane, and configured to define a first set of concentric helical primary and secondary coils and a second set of concentric helical primary and secondary coils arranged next to the first set and connected to the first set to define a clockwise transformer current path in the first set and a counter-clockwise transformer current path in the second set.

2. A method in a semiconductor device of increasing signal immunity to external magnetic fields, comprising
providing a voltage isolation on-chip transformer that includes a primary and a secondary winding, the primary and secondary windings defined as substantially parallel traces in the same plane and formed as part of a semiconductor process to define a primary and a secondary winding formed in a common plane, and configured to provide a first portion of the primary and windings having a clockwise spiral configuration to define a clockwise transformer current path and a second portion of the primary and secondary windings having a counter-clockwise spiral configuration arranged next to the first portion and connected to the first portion to define a counter-clockwise transformer current path.

3. A method of claim 2, wherein the primary and secondary windings are formed using photolithographic techniques.

* * * * *